US012804836B2

(12) United States Patent
Ryu et al.

(10) Patent No.: US 12,804,836 B2
(45) Date of Patent: Nov. 17, 2026

(54) ELECTRONIC DEVICE COMPRISING ACOUSTIC MODULE

(71) Applicant: SAMSUNG ELECTRONICS CO., LTD., Suwon-si (KR)

(72) Inventors: Heejun Ryu, Suwon-si (KR); Kwangeun Go, Suwon-si (KR); Sungkeun Koo, Suwon-si (KR); Dongju Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 19/062,876

(22) Filed: Feb. 25, 2025

(65) Prior Publication Data

US 2025/0194035 A1 Jun. 12, 2025

Related U.S. Application Data

(63) Continuation of application No. PCT/KR2023/013566, filed on Sep. 11, 2023.

(30) Foreign Application Priority Data

Sep. 28, 2022 (KR) ........................ 10-2022-0123386
Oct. 20, 2022 (KR) ........................ 10-2022-0135671

(51) Int. Cl.
*H05K 5/06* (2006.01)
*H04R 1/04* (2006.01)
*H04R 1/08* (2006.01)

(52) U.S. Cl.
CPC ................. *H05K 5/06* (2013.01); *H04R 1/04* (2013.01); *H04R 1/086* (2013.01); *H04R 2499/11* (2013.01); *H04R 2499/15* (2013.01)

(58) Field of Classification Search
CPC .......... H04R 1/023; H04R 1/04; H04R 1/086; H04R 1/28; H04R 1/44; H04R 2499/11; H04R 2499/15; G06F 1/16; H05K 5/06
See application file for complete search history.

(56) References Cited

U.S. PATENT DOCUMENTS 6,512,834 B1 1/2003 Banter et al.
2019/0297429 A1* 9/2019 Zuo ........................ H04R 19/04
2021/0092499 A1* 3/2021 Fukushima ........... G06F 1/1688

FOREIGN PATENT DOCUMENTS

CN 201821470 U 5/2011
CN 104254039 A 12/2014
(Continued)

OTHER PUBLICATIONS

International Search Report (PCT/ISA/210) issued by the International Searching Authority on Dec. 12, 2023 in corresponding International Application No. PCT/KR2023/013566.
(Continued)

*Primary Examiner* — Robin J Mishler
(74) *Attorney, Agent, or Firm* — Sughrue Mion, PLLC

(57) ABSTRACT

An electronic device, includes: a housing including a front surface, a rear surface, a side surface surrounding an inner space between the front surface and the rear surface, and a sound hole; a display; a front frame in the inner space and including an acoustic duct; a printed circuit board (PCB) including a first substrate surface, a second substrate, and an opening overlapping the acoustic duct; an acoustic module including a microphone overlapping the opening; and a waterproof assembly between the PCB and the front frame and overlapping the opening, and configured to transmit sound to the microphone from the acoustic duct through the opening. The waterproof assembly includes: a vibrating membrane; a compressible first sealing member on the vibrating membrane and facing the PCB; and a compressible
(Continued)

second sealing member between the vibrating membrane and the first sealing member and having different physical properties than the first sealing member.

15 Claims, 12 Drawing Sheets

(56) References Cited

FOREIGN PATENT DOCUMENTS

| | | | |
|---|---|---|---|
| CN | 106792299 | B | 7/2019 |
| CN | 112492489 | B | 6/2022 |
| CN | 216774967 | U | 6/2022 |
| KR | 10-2017-0023390 | A | 3/2017 |
| KR | 10-1816107 | B1 | 1/2018 |
| KR | 10-2331665 | B1 | 11/2021 |
| KR | 10-2336429 | B1 | 12/2021 |
| KR | 10-2022-0130454 | A | 9/2022 |

OTHER PUBLICATIONS

Written Opinion (PCT/ISA/237) issued by the International Searching Authority on Dec. 12, 2023 in corresponding International Application No. PCT/KR2023/013566.

* cited by examiner

ELECTRONIC DEVICE COMPRISING ACOUSTIC MODULE

CROSS-REFERENCE TO RELATED APPLICATIONS

This application is a continuation of International Application No. PCT/KR2023/013566, filed on Sep. 11, 2023, which is based on and claims priority to Korean Patent Application No. 10-2022-0123386, filed on Sep. 28, 2022, in the Korean Intellectual Property Office, and Korean Patent Application No. 10-2022-0135671, filed on Oct. 20, 2022, in the Korean Intellectual Property Office, the disclosures of which are incorporated by reference herein in their entireties.

BACKGROUND

1. Field

The present disclosure relates to an electronic device including an acoustic module.

2. Description of Related Art

An electronic device including a smartphone, a wearable device, a tablet personal computer (PC), and the like may include an acoustic module for generating sounds or accommodating sounds generated from the outside of the electronic device. The acoustic module may be mounted in a housing of the electronic device to emit or accommodate sounds through a sound hole formed in the housing. The acoustic module may include a waterproof structure for preventing a foreign substance from entering through the sound hole while mounted in the housing.

SUMMARY

According to an aspect of the present disclosure, an electronic device includes: a housing including a front surface, a rear surface opposite to the front surface, a side surface surrounding an inner space between the front surface and the rear surface, and a sound hole configured to transmit sound from the outside to the inner space; a display visually exposed to the outside through the front surface; a front frame in the inner space and including an acoustic duct communicating with the sound hole and through which the sound may travel; a printed circuit board (PCB) in the inner space and including a first substrate surface, a second substrate surface opposite to the first substrate surface and facing the front frame, and an opening overlapping the acoustic duct in a direction toward the first substrate surface; an acoustic module on the first substrate surface and including a microphone overlapping the opening in a direction facing the first substrate surface; and a waterproof assembly between the PCB and the front frame and overlapping the opening in the direction toward the first substrate surface, and configured to transmit sound to the microphone from the acoustic duct through the opening. The waterproof assembly includes: a vibrating membrane configured to transmit sound through vibration; a first sealing member on the vibrating membrane and facing the PCB, the first sealing member being a compressible material; and a second sealing member between the vibrating membrane and the first sealing member, the second sealing member being a compressible material. The first sealing member and the second sealing member have different physical properties.

An elastic modulus of the first sealing member may be different from an elastic modulus of the second sealing member.

The first sealing member may be a first material and the second sealing member may be a second material, and the first material and the second material may be different materials.

The first sealing member may be a rubber material. The second sealing member may be a sponge material.

The first sealing member may be a first material and the second sealing member may be a second material. The first material and the second material may be the same material. The first material and the second material may have different densities.

The first sealing member may have a first density and the second sealing member may have a second density less than the first density.

The first sealing member may have a first thickness. The second sealing member may have a second thickness different from the first thickness.

The first sealing member may include a first through hole penetrating in a thickness direction. The second sealing member have include a second through hole penetrating in the thickness direction and overlapping the first through hole in the thickness direction.

The waterproof assembly may further include: at least one of a first adhesive layer between the first sealing member and the second sealing member and connecting the first sealing member and the second sealing member or a second adhesive layer between the second sealing member and the vibrating membrane and connecting the second sealing member and the vibrating membrane. Each of the first adhesive layer and the second adhesive layer may include an adhesive through hole overlapping the first through hole and the second through hole.

The waterproof assembly may further include a third adhesive layer on a surface of the vibrating membrane opposite to the first sealing member and may be configured to attach the waterproof assembly to the front frame.

The waterproof assembly may be mounted on the front frame. The front frame may include a seating portion configured to maintain a position of the waterproof assembly. The seating portion may communicate with the acoustic duct.

The seating portion may be configured to support at least a portion of a periphery of the waterproof assembly in a direction toward the first substrate surface in a state in which the waterproof assembly is secured.

In a state in which the PCB is secured to the front frame, the second substrate surface may contact at least a portion of the front frame, and the waterproof assembly may be between the PCB and the front frame in a compressed state in a thickness direction.

The first sealing member may include: a first portion contacting the second substrate surface in a state in which the PCB is secured to the front frame; and a second portion connected to the first portion and facing the vibrating membrane, of the second portion may be a different material than the first portion. The second sealing member may include: a third portion facing the second portion; and a fourth portion connected to the third portion and facing the vibrating membrane, of the fourth portion may be a different material than the third portion.

The front frame may be between the display and the PCB.

BRIEF DESCRIPTION OF DRAWINGS

The above and other aspects, features, and advantages of certain embodiments of the present disclosure may be more apparent from the following description taken in conjunction with the accompanying drawings, in which.

DETAILED DESCRIPTION

Figure 1:
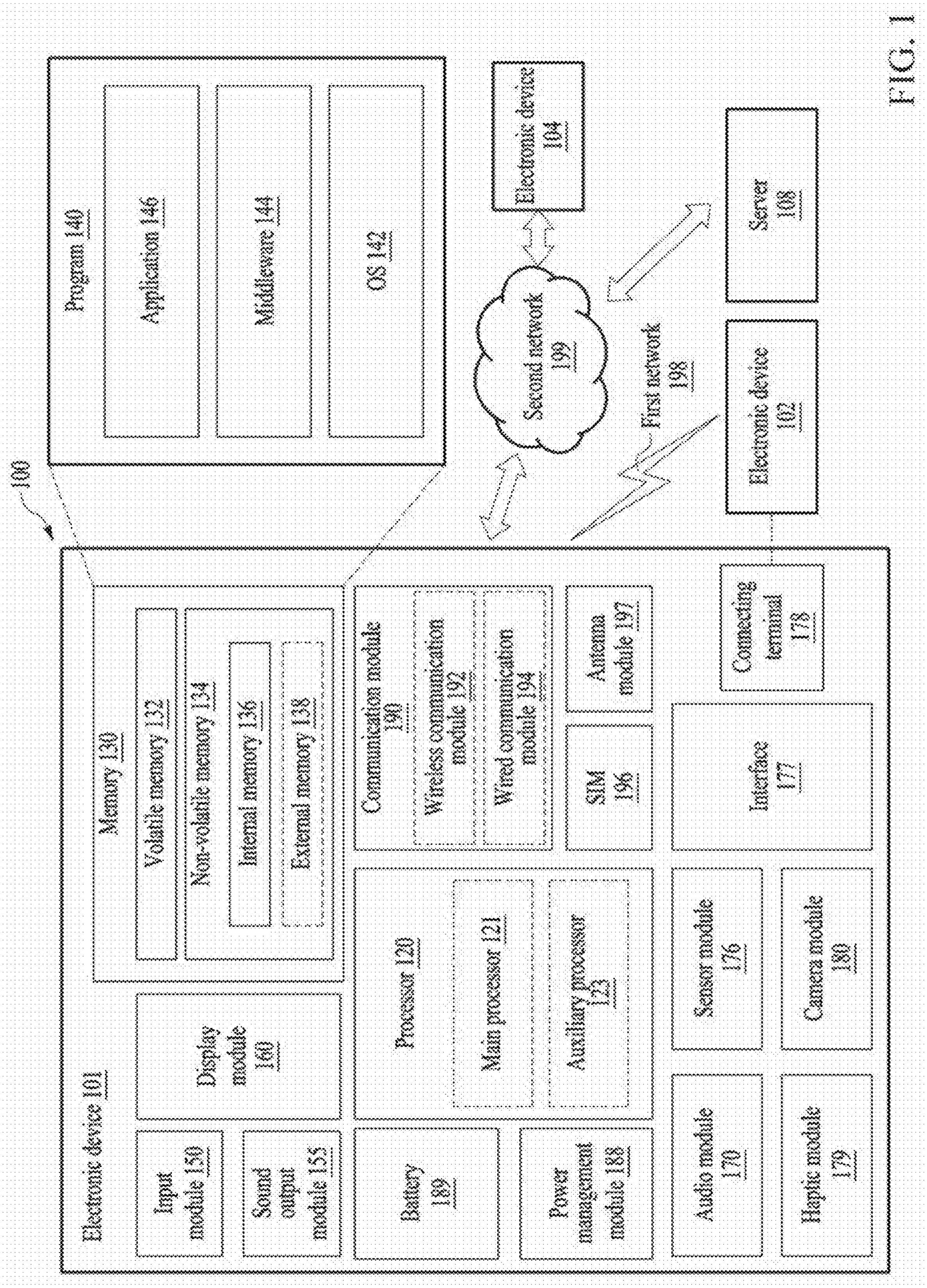
FIG. 1 is a block diagram of an electronic device in a network environment according to various embodiments.

Hereinafter, embodiments will be described in detail with reference to the accompanying drawings. When describing the embodiments with reference to the accompanying drawings, like reference numerals refer to like elements and a repeated description related thereto will be omitted.

FIG. 1 is a block diagram illustrating an electronic device in a network environment according to embodiments. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to various embodiments, the electronic device 101 may communicate with the electronic device 104 via the server 108. According to various embodiments, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to various embodiments, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to various embodiments, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to various embodiments, the auxiliary processor 123 (e.g., an ISP or a CP) may be implemented as a portion of another component (e.g., the camera module 180 or the communication module 190) that is functionally related to the auxiliary processor 123. According to various embodiments, the auxiliary processor 123 (e.g., an NPU) may include a hardware structure specified for artificial intelligence (AI) model processing. The AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various pieces of data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to various embodiments, the receiver may be implemented separately from the speaker or as a part of the speaker.

The display module 160 may visually provide information to the outside (e.g., a user) of the electronic device 101. The display module 160 may include, for example, a display, a hologram device, or a projector and control circuitry to control a corresponding one of the display, the hologram device, or the projector. According to various embodiments, the display module 160 may include a touch sensor adapted to sense a touch, or a pressure sensor adapted to measure an intensity of a force incurred by the touch.

The audio module 170 may convert a sound into an electric signal or vice versa. According to various embodiments, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to various embodiments, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to various embodiments, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to various embodiments, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to various embodiments, the haptic module 179 may include, for example, a motor, a piezoelectric element, or an electric stimulator.

The camera module 180 may capture a still image and moving images. According to various embodiments, the camera module 180 may include one or more lenses, image sensors, ISPs, or flashes.

The power management module 188 may manage power supplied to the electronic device 101. According to various embodiments, the power management module 188 may be implemented as, for example, at least a part of a power management integrated circuit (PMIC).

The battery 189 may supply power to at least one component of the electronic device 101. According to various embodiments, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to various embodiments, the communication module 190 may include a wireless communication module 192 (e.g., a cellular communication module, a short-range wireless communication module, or a global navigation satellite system (GNSS) communication module) or a wired communication module 194 (e.g., a local region network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide region network (WAN)). These various types of communication modules may be implemented as a single component (e.g., a single chip), or may be implemented as multi components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and a next-generation communication technology, e.g., a new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to various embodiments, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to various embodiments, the antenna module 197 may include an antenna including a radiating element including a conductive material or a conductive pattern formed in or on a substrate (e.g., a printed circuit board (PCB)). According to various embodiments, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to various embodiments, another component (e.g., a radio frequency integrated circuit (RFIC)) other than the radiating element may be additionally formed as a portion of the antenna module 197.

According to various embodiments, the antenna module 197 may form a mmWave antenna module. According to various embodiments, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to various embodiments, commands or data may be transmitted or received between the electronic device 101 and the external electronic device 104 via the server 108 coupled with the second network 199. Each of the external electronic devices 102 or 104 may be a device of the same type as or a different type from the electronic device 101. According to various embodiments, all or some of operations to be executed by the electronic device 101 may be executed at one or more external electronic devices (e.g., the external devices 102 and 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least a portion of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or MEC. In various embodiments, the external electronic device 104 may include an Internet-of-things (IoT) device. The server 108 may be an intelligent server using machine learning and/or a neural network. According to various embodiments, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to the embodiments disclosed herein may be one of various types of electronic devices. The electronic device may include, for example, a portable communication device (e.g., a smartphone), a computer device, a portable multimedia device, a portable medical device, a camera, a wearable device, a home appliance device, or the like. According to various embodiments of the disclosure, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to various embodiments, the module may be implemented in a form of an application-specific integrated circuit (ASIC).

Embodiments as set forth herein may be implemented as software (e.g., the program 140) including one or more instructions that are stored in a storage medium (e.g., the internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to various embodiments, a method according to various embodiments of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

Figure 2:
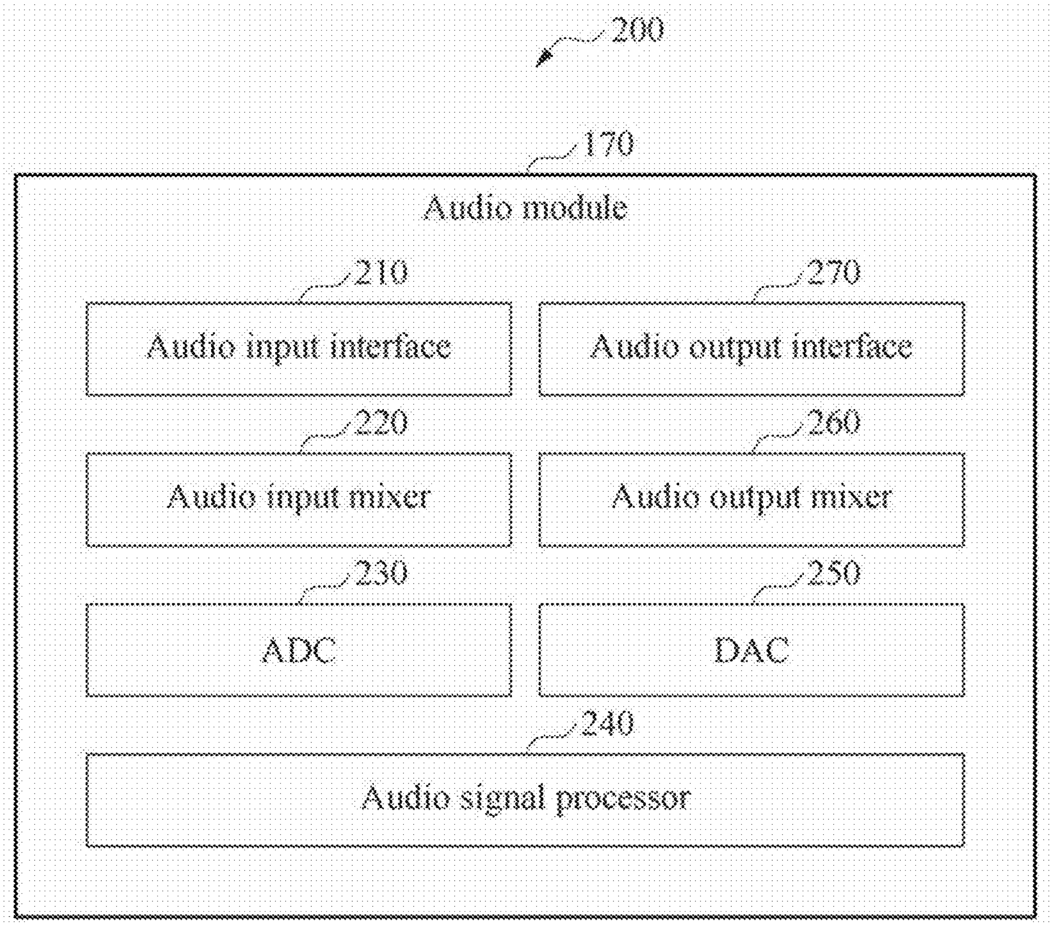
FIG. 2 is a block diagram of an audio module of an electronic device according to various embodiments.

FIG. 2 is a block diagram of an audio module of an electronic device according to various embodiments.

Referring to FIG. 2, the audio module 170 may include an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of the electronic device 101 via a microphone (e.g., a dynamic microphone, a condenser microphone, or a piezo microphone) that is configured as part of the input module 150 or separately from the electronic device 101. For example, if an audio signal is obtained from the external electronic device 102 (e.g., a headset or a microphone), the audio input interface 210 may be connected with the external electronic device 102 directly via the connecting terminal 178, or wirelessly (e.g., Bluetooth™ communication) via the wireless communication module 192 to receive the audio signal. According to various embodiments, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to various embodiments, additionally or alternatively, the audio input interface 210 may receive an audio signal from another component (e.g., the processor 120 or the memory 130 of FIG. 1) of the electronic device 101.

The audio input mixer 220 may synthesize a plurality of input audio signals into at least one audio signal. For example, according to various embodiments, the audio input mixer 220 may synthesize a plurality of analog audio signals input via the audio input interface 210 into at least one analog audio signal.

The ADC 230 may convert an analog audio signal into a digital audio signal. For example, according to various embodiments, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 101. For example, according to various embodiments, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to various embodiments, one or more functions of the audio signal processor 240 may be implemented in the form of an equalizer.

The DAC 250 may convert a digital audio signal into an analog audio signal. For example, according to various embodiments, the DAC 250 may convert a digital audio signal processed by the audio signal processor 240 or a digital audio signal obtained from another component (e.g., the processor 120 or the memory 130) of the electronic device 101 into an analog audio signal.

The audio output mixer 260 may synthesize a plurality of audio signals, which are to be output, into at least one audio signal. For example, according to various embodiments, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 via the sound output module 155. The sound output module 155 may include, for example, a speaker, such as a dynamic driver or a balanced armature driver, or a receiver. According to various embodiments, the sound output module 155 may include a plurality of speakers. In such a case, the audio output interface 270 may output audio signals having a plurality of different channels (e.g., stereo channels or 5.1 channels) via at least some of the plurality of speakers. According to various embodiments, the audio output interface 270 may be connected with the external electronic device 102 (e.g., an external speaker or a headset) directly via the connecting terminal 178 or wirelessly via the wireless communication module 192 to output an audio signal.

According to various embodiments, the audio module 170 may generate, without separately including the audio input mixer 220 or the audio output mixer 260, at least one digital audio signal by synthesizing a plurality of digital audio signals using at least one function of the audio signal processor 240.

According to various embodiments, the audio module 170 may include an audio amplifier (not shown) (e.g., a speaker amplifying circuit) that is capable of amplifying an analog audio signal input via the audio input interface 210 or an audio signal that is to be output via the audio output interface 270. According to various embodiments, the audio amplifier may be configured as a module separate from the audio module 170.

Figure 3A:
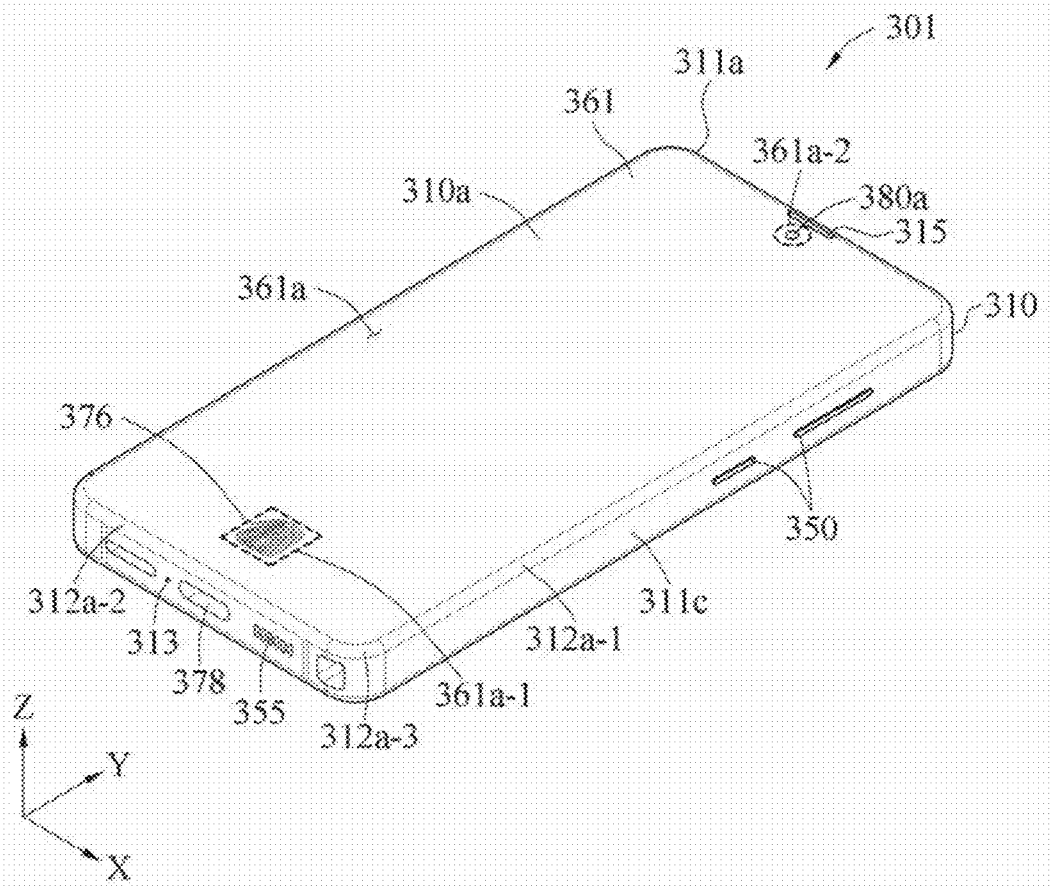
FIG. 3A is a front perspective view of an electronic device according to various embodiments.
Figure 3B:
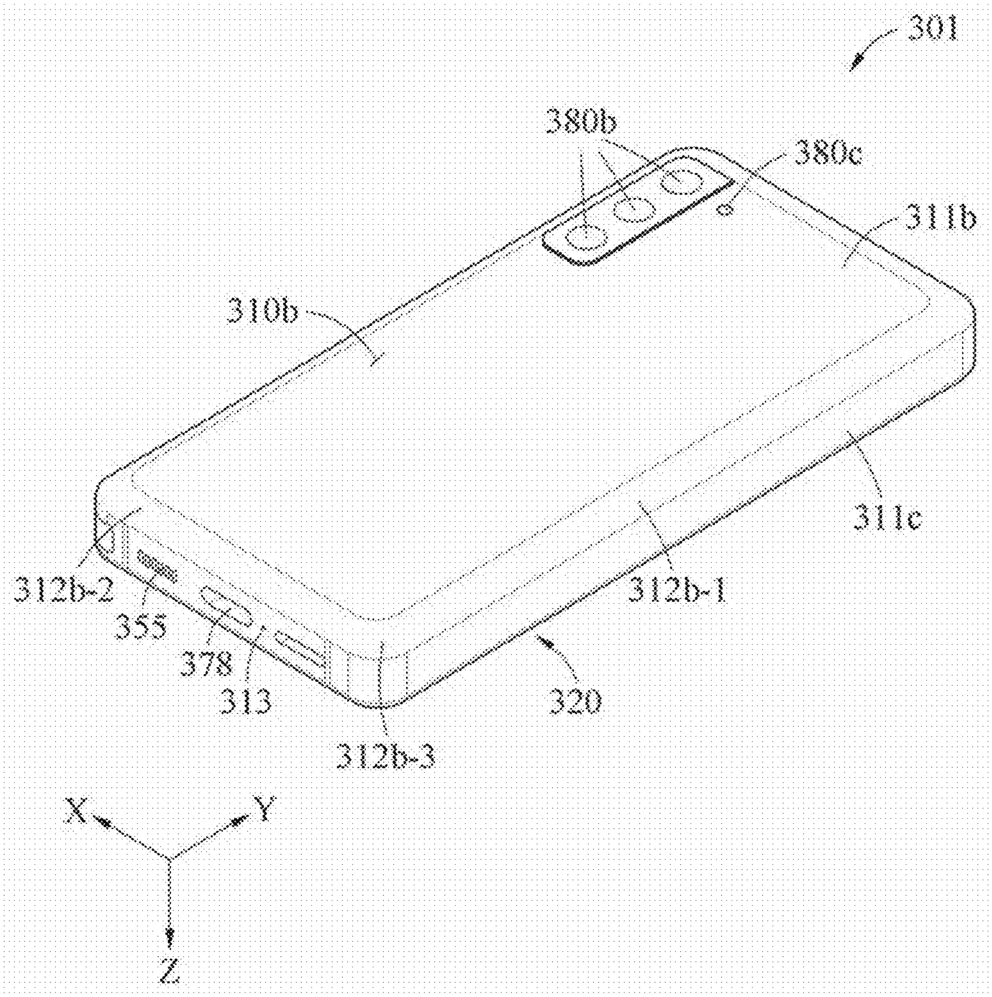
FIG. 3B is a rear perspective view of the electronic device according to various embodiments.
Figure 4:
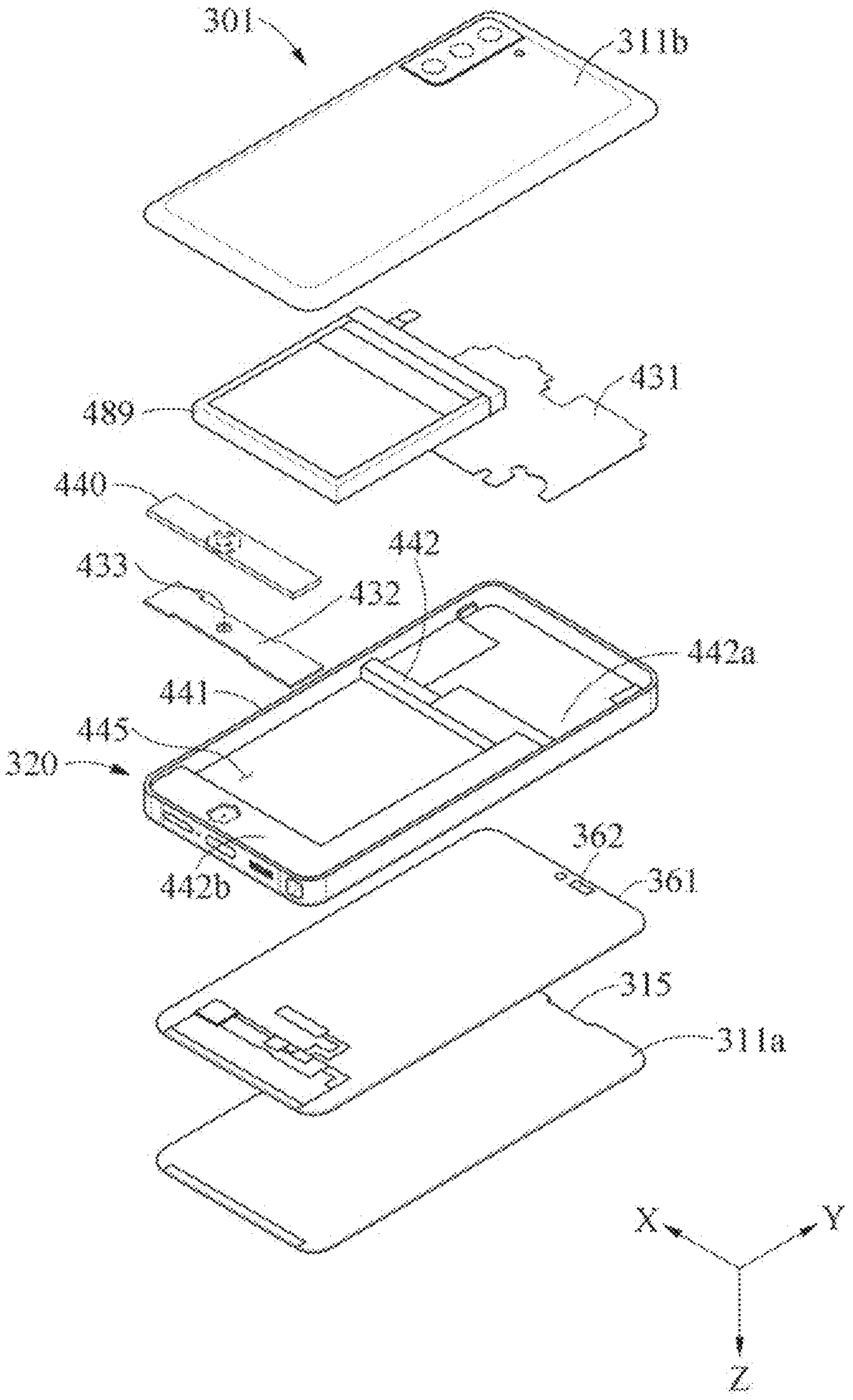
FIG. 4 is an exploded perspective view of an electronic device according to various embodiments.

FIG. 3A is a front perspective view of an electronic device according to various embodiments, FIG. 3B is a rear perspective view of the electronic device according to various embodiments, and FIG. 4 is an exploded perspective view of the electronic device according to various embodiments.

Referring to FIGS. 3A, 3B, and 4, an electronic device 301 (e.g., the electronic device 101 of FIG. 1) according to various embodiments may include a housing 310 having a front surface 310*a* (e.g., a first surface), a rear surface 310*b* (e.g., a second surface), and a side surface 311*c* (e.g., a third surface) surrounding an inner space between the front surface 310*a* and the rear surface 310*b*.

In various embodiments, the front surface 310*a* may be formed by a first plate 311*a* of which at least a portion is substantially transparent. For example, the first plate 311*a* may include a polymer plate or a glass plate including at least one coating layer. In various embodiments, the rear surface 310*b* may be formed by a second plate 311*b* that is substantially opaque. For example, the second plate 311*b* may be formed of coated or tinted glass, ceramic, polymer, metal (e.g., aluminum, stainless steel, or magnesium), or a combination thereof. The side surface 311*c* may be formed by a frame 320 that is coupled to the first plate 311*a* and the second plate 311*b* and includes a metal and/or a polymer. In various embodiments, the second plate 311*b* and the frame 320 may be integrally and seamlessly formed. In various embodiments, the second plate 311*b* and the frame 320 may be formed of substantially the same material (e.g., aluminum).

In various embodiments, the first plate 311*a* may include a plurality of first periphery areas 312*a*-1 that are rounded in a direction from at least one area of the front surface 310*a* toward the second plate 311*b* and extend in one direction (e.g., a +/−Y-axis direction), a plurality of second periphery areas 312*a*-2 that are rounded in the direction from at least one area of the front surface 310*a* toward the second plate 311*b* and extend in the other direction (e.g., a +/−X-axis direction), and a plurality of third periphery areas 312*a*-3 that are rounded in the direction from at least one area of the front surface 310*a* toward the second plate 311*b* and positioned between the plurality of first periphery areas 312*a*-1 and the plurality of second periphery areas 312*a*-2.

In various embodiments, the second plate 311*b* may include a plurality of fourth periphery areas 312*b*-1 that are rounded in a direction from at least one area of the rear surface 310*b* toward the first plate 311*a* and extend in one direction (e.g., the +/−Y-axis direction), a plurality of fifth periphery areas 312*b*-2 that are rounded in the direction from at least one area of the rear surface 310*b* toward the first plate 311*a* and extend in the other direction (e.g., the +/−X-axis direction), and a plurality of sixth periphery areas 312*b*-3 that are rounded in the direction from at least one area of the rear surface 310*b* toward the first plate 311*a* and positioned between the plurality of fourth periphery areas 312*b*-1 and the plurality of fifth periphery areas 312*b*-2.

In various embodiments, the frame 320 may surround at least a portion of the inner space between the front surface 310*a* and the rear surface 310*b*. The frame 320 may include a first support structure 441 disposed on at least a portion of the side surface 311*c* and a second support structure 442 connected to the first support structure 441 to form a space for disposing the components of the electronic device 301.

In various embodiments, the first support structure 441 may connect the periphery of the first plate 311*a* and the periphery of the second plate 311*b* and surround the space between the first plate 311*a* and the second plate 311*b*, thereby forming the side surface 311*c* of the housing 310.

In various embodiments, the second support structure 442 may be disposed inside (or in a body portion) of the electronic device 301. The second support structure 442 may be integrally formed with the first support structure 441 or may be formed separately from the first support structure 441 and connected to the first support structure 441. In various embodiments, PCBs 431 and 432 may be disposed on the second support structure 442. The second support structure 442 may be connected to, for example, the grounds of the PCBs 431 and 432.

In various embodiments, a display 361 may be disposed on one surface (e.g., a lower surface (a surface in a +Z-axis direction) of FIG. 4) of the second support structure 442, and the second plate 311*b* may be disposed on the other surface (e.g., an upper surface (a surface in a −Z-axis direction) of FIG. 4) of the second support structure 442.

In various embodiments, at least a portion of the frame 320 may be formed of a conductive material. For example, the first support structure 441 may be formed of a metal and/or conductive polymer material. In various embodiments, the second support structure 442 may be formed of a metal and/or conductive polymer material, like the first support structure 441.

In various embodiments, an acoustic duct (e.g., an acoustic duct 521 of FIG. 5) may be formed on the frame 320 to transfer sounds between the inside and the outside of the housing 310. In various embodiments, the acoustic duct formed on the frame 320 may communicate with external sound holes 313, 315, and 355 of the electronic device 301. In various embodiments, external sounds of the electronic device 301 may be transferred to the inner space, for example, a microphone (e.g., a microphone 541 of FIG. 6) of an acoustic module 440 via the sound hole 313 and the acoustic duct.

In various embodiments, the electronic device 301 may include the display 361 (e.g., the display module 160 of FIG. 1). In various embodiments, the display 361 may be disposed on the front surface 310*a*. In various embodiments, the display 361 may be exposed through at least a portion (e.g., the plurality of first periphery areas 312*a*-1, the plurality of second periphery areas 312*a*-2, and the plurality of third periphery areas 312*a*-3) of the first plate 311*a*.

In various embodiments, the periphery of the display 361 may substantially coincide with an outer edge of the first plate 311*a*. In various embodiments, the display 361 may include a touch sensing circuit, a pressure sensor for sensing the intensity (pressure) of a touch, and/or a digitizer for detecting a magnetic-type stylus pen.

In various embodiments, the display 361 may include a screen display area 361*a* that is visually exposed to display content through a pixel or a plurality of cells. In various embodiments, the screen display area 361*a* may include a sensing area 361*a*-1 and a camera area 361*a*-2. In this case, the sensing area 361*a*-1 may overlap at least one area of the screen display area 361*a*. The sensing area 361*a*-1 may allow transmission of an input signal related to a sensor module 376 (e.g., the sensor module 176 of FIG. 1). The sensing area 361*a*-1 may display content, like the screen display area 361*a* that does not overlap the sensing area

361*a*-1. For example, the sensing area 361*a*-1 may display the content while the sensor module 376 is not operating. The camera area 361*a*-2 may overlap at least one area of the screen display area 361*a*.

In various embodiments, the electronic device 301 may include the acoustic module 440 (e.g., the audio module 170 of FIG. 1). The acoustic module 440 may obtain sounds from the outside of the electronic device 301. For example, the acoustic module 440 may be positioned in the inner space of the housing 310. In various embodiments, the acoustic module 440 may obtain a sound via at least one sound hole 313.

In various embodiments, the electronic device 301 may include the sensor module 376. The sensor module 376 may sense a signal applied to the electronic device 301. The sensor module 376 may be positioned, for example, on the front surface 310*a* of the electronic device 301. The sensor module 376 may form the sensing area 361*a*-1 in at least a portion of the screen display area 361*a*. The sensor module 376 may receive an input signal transmitted through the sensing area 361*a*-1 and generate an electrical signal based on the received input signal. For example, the input signal may have a designated physical quantity (e.g., heat, light, temperature, sound, pressure, or ultrasound). In another example, the input signal may include a signal related to biometric information (e.g., a fingerprint, a voice, and the like) of a user.

In various embodiments, the electronic device 301 may include camera modules 380*a* and 380*b* (e.g., the camera module 180 of FIG. 1). In various embodiments, the camera modules 380*a* and 380*b* may include a first camera module 380*a*, a second camera module 380*b*, and a flash 380*c*. In various embodiments, the first camera module 380*a* may be disposed to be exposed through the front surface 310*a* of the housing 310, and the second camera module 380*b* and the flash 380*c* may be disposed to be exposed through the rear surface 310*b* of the housing 310. In various embodiments, at least a portion of the first camera module 380*a* may be disposed in the housing 310 to be covered through the display 361. In various embodiments, the first camera module 380*a* may receive an optical signal transmitted through the camera area 361*a*-2. In various embodiments, the second camera module 380*b* may include a plurality of cameras (e.g., dual cameras, triple cameras, or quad cameras). In various embodiments, the flash 380*c* may include a light-emitting diode or a xenon lamp.

In various embodiments, the electronic device 301 may include the external sound holes 315 and 355. The external sound holes 315 and 355 may output a sound to the outside of the electronic device 301, and the electronic device 301 may include a plurality of external sound holes 315 and 355. In various embodiments, the electronic device 301 may include the sound hole 313 through which a sound from the outside of the electronic device 301 may be input to the inside of the electronic device 301.

For example, the first external sound hole 315 may be formed adjacent to the side surface 311*c* in one direction (e.g., the +Y direction) of the housing 310 and, specifically, to the first camera module 380*a* or the camera area 361*a*-2 of the display 361. The second external sound hole 355 may be at least one or more holes formed on the side surface 311*c* in one direction (e.g., the −Y direction) of the housing 310. The electronic device 301 may output a stereophonic sound to the outside of the electronic device 301 through the first external sound hole 315 and the second external sound hole 355.

In various embodiments, an engraved area of the first external sound hole 315 may be provided on the outer edge of the first plate 311*a*, wherein the first plate 311*a* and the display 361 may be coupled, and the engraved area may be implemented as the first external sound hole 315.

According to various embodiments, the electronic device 301 may not include the first external sound hole 315 and may directly output a sound to the outside via a sound hole 362. The display 361 according to various embodiments may include a notch structure in which the sound hole 362 and the first camera module 380*a* are positioned.

In various embodiments, the electronic device 301 may include an input module 350 (e.g., the input module 150 of FIG. 1). The input module 350 may receive a manipulation signal from a user. The input module 350 may include, for example, at least one key input device disposed to be exposed on the side surface 311*c* of the housing 310.

In various embodiments, the electronic device 301 may include a connecting terminal 378 (e.g., the connecting terminal 178 of FIG. 1). In various embodiments, the connecting terminal 378 may be disposed on the side surface 311*c*. For example, when the electronic device 301 is viewed in one direction (e.g., the +Y-axis direction of FIG. 3A), the connecting terminal 378 may be disposed on a central portion of the side surface 311*c*, and the external sound hole 355 may be disposed in one direction (e.g., a right direction) with respect to the connecting terminal 378.

In various embodiments, the electronic device 301 may include one or more PCBs (e.g., the PCBs 431 and 432) and a battery 489 (e.g., the battery 189 of FIG. 1). In various embodiments, the PCBs 431 and 432 may include the first PCB 431 and the second PCB 432. In this case, the first PCB 431 may be accommodated in a first board slot 442*a* of the second support structure 442, and the second PCB 432 may be accommodated in a second board slot 442*b* of the second support structure 442. In various embodiments, the battery 489 may be accommodated in a battery slot 445 of the second support structure 442 formed between the first board slot 442*a* and the second board slot 442*b*.

In various embodiments, electrical circuits for transmitting electrical signals may be formed on the PCBs 431 and 432. In various embodiments, one or more electrical components for achieving the functions of the electronic device 301 may be disposed (e.g., mounted) on surfaces of the PCBs 431 and 432. For example, the electrical components may include components, such as an AP, a GPU, and a PMIC, for performing functions in the electronic device 301. In various embodiments, the second PCB 432 may have an opening 433 that is partially open to penetrate the surface. In various embodiments, the acoustic module 440 for performing sound functions may be disposed on the PCBs 431 and 432.

In various embodiments, a processor (e.g., the processor 120 of FIG. 1) may be disposed on the PCBs 431 and 432. The processor may include, for example, one or more of a CPU, an AP, an image signal processor, a sensor hub processor, or a communication processor. In various embodiments, a wireless communication circuit (e.g., the wireless communication module 192 of FIG. 1) may be disposed on the PCBs 431 and 432. The wireless communication circuit may perform communication with, for example, an external device (e.g., the electronic device 104 of FIG. 1). The electronic device 301 may include an antenna structure (e.g., the antenna module 197 of FIG. 1), and the wireless communication circuit may be electrically connected to the antenna structure. In various embodiments, the wireless communication circuit may generate a signal to be transmitted through the antenna structure or detect a signal received through the antenna structure. In various embodiments, the PCBs 431 and 432 may include grounds, and the grounds of the PCBs 431 and 432 may function as a ground of the antenna structure implemented using the wireless communication circuit.

In various embodiments, the electronic device 301 may include the acoustic module 440 including one or more microphones. In various embodiments, the acoustic module 440 may generate an electrical signal according to a sound transmitted from the outside of the electronic device 301. In another embodiment, the acoustic module 440 may include a speaker, and generate a sound according to an electrical signal. In various embodiments, the acoustic module 440 including the microphone and the acoustic module 440 including the speaker may be individually provided in the electronic device 301. In various embodiments, one acoustic module 440 may include a microphone and a speaker at the same time. In the following description, the acoustic module 440 may include a microphone, but the embodiments are not limited thereto. In various embodiments, the acoustic module 440 may be electrically connected to the second PCB 432 directly or indirectly to generate an electrical signal according to a sound received via the microphone. The second PCB 432 may be formed with the opening 433 that is open to penetrate at least a portion of the surface to allow sound to travel between the microphone of the acoustic module 440 and the acoustic duct (e.g., the acoustic duct 521 of FIG. 5). In various embodiments, the acoustic module 440 may be positioned on the second PCB 432 such that the microphone is positioned in the opening 433 of the second PCB 432. In various embodiments, sound waves that enter the acoustic duct from outside the electronic device 301 through the sound hole 313 may pass through the opening 433 of the second PCB 432 and be input to the microphone of the acoustic module 440.

Figure 5:
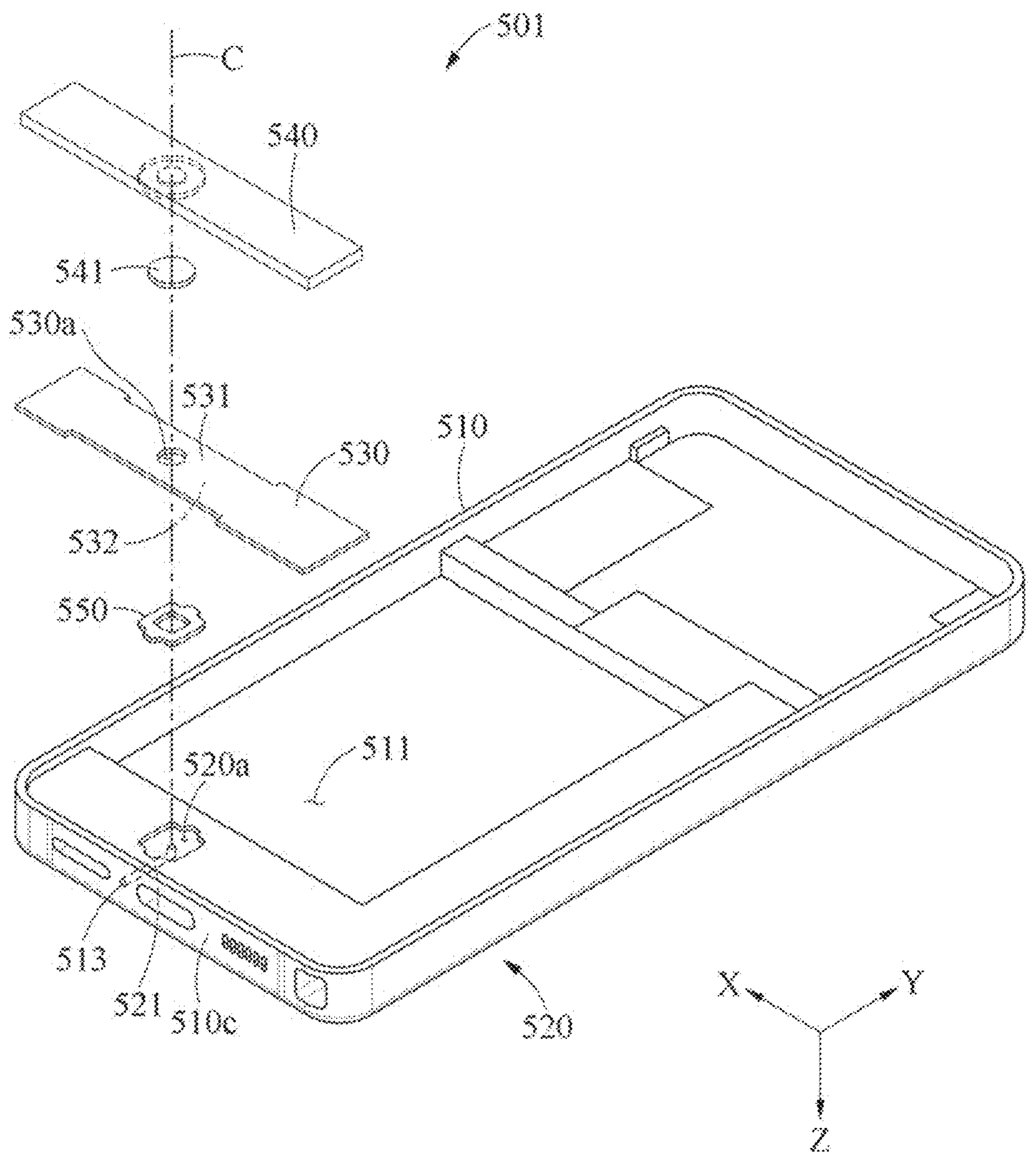
FIG. 5 is a partial exploded perspective view of an electronic device illustrating an acoustic module according to various embodiments.
Figure 6:
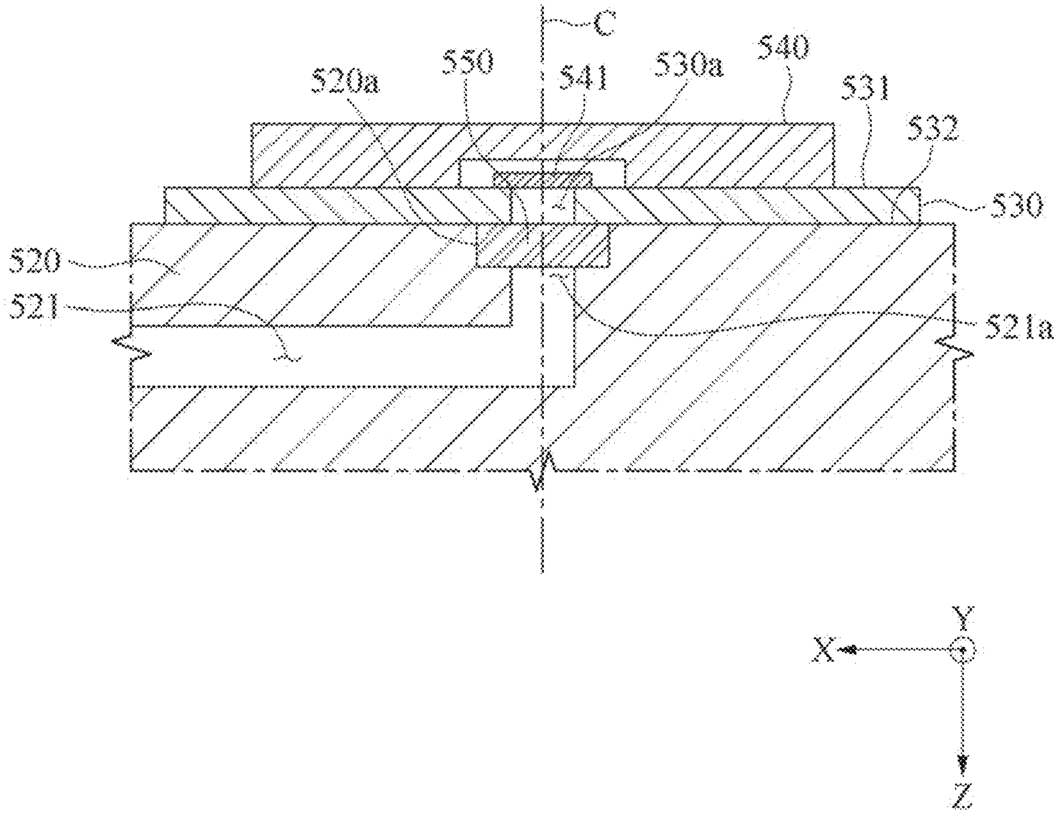
FIG. 6 is a cross-sectional view of a front frame, a waterproof assembly, a printed circuit board (PCB), and an acoustic module in an assembled state of an electronic device according to various embodiments.

FIG. 5 is a partial exploded perspective view of an electronic device illustrating an acoustic module according to various embodiments, and FIG. 6 is a cross-sectional view of a front frame, a waterproof assembly, a PCB, and an acoustic module in an assembled state of an electronic device according to various embodiments.

Referring to FIGS. 5 and 6, an electronic device 501 (e.g., the electronic device 301 of FIG. 3A) according to various embodiments may include a housing 510 (e.g., the housing 310 of FIG. 3A), a display (e.g., the display 361 of FIG. 4), a front frame 520 (e.g., the frame 320 of FIG. 4), a PCB 530 (e.g., the PCB 432 of FIG. 4), an acoustic module 540 (e.g., the acoustic module 440 of FIG. 4), and a waterproof assembly 550.

In various embodiments, the housing 510 may form an exterior of the electronic device 501. In various embodiments, the housing 510 may form an inner space 511 therein. In various embodiments, a sound hole 513 (e.g., the sound hole 313 of FIG. 3A) may be formed on the outer surface of the housing 510. For example, the sound hole 513 may be formed on a side surface 510*c* of the housing 510. In various embodiments, the display may be disposed on a front surface (e.g., a surface facing the +Z direction of the housing 510) of the housing 510.

In various embodiments, the front frame 520 may surround at least a portion of the inner space 511 between a front surface 510*a* and a rear surface 510*b*. In various embodiments, at least a portion of the front frame 520 may be disposed adjacent to the side surface 510*c* of the housing 510. For example, the front frame 520 may be provided such that at least a portion thereof is adjacent to a portion of the side surface 510*c* of the housing 510 in which the sound hole 513 is formed. In various embodiments, the front frame 520 may be formed separately from the housing 510, or may be formed integrally with the housing 510. For example, the front frame 520 may form at least a portion of the side surface 510*c* of the housing 510.

In various embodiments, an acoustic duct 521 for sound to travel through may be formed in the front frame 520. In various embodiments, the acoustic duct 521 may be formed through the interior of the front frame 520 and may function as a path through which sound may travel. In various embodiments, based on the path formed by the acoustic duct 521, one end of the acoustic duct 521 may communicate with the sound hole 513 formed in the housing 510. In various embodiments, the acoustic duct 521 may include an open portion 521*a* formed in the front frame 520 to be open in the inner space 511 of the housing 510. In various embodiments, the open portion 521*a* may be formed open towards the microphone 541 of the acoustic module 540, which is described later. For example, the open portion 521*a* of the acoustic duct 521 may be open in a direction (e.g., in the −Z direction) opposite to the display.

In various embodiments, a seating portion 520*a* may be formed on the front frame 520. In various embodiments, the seating portion 520*a* may be formed in a recessed form on a surface (e.g., a surface facing the −Z direction) of the front frame 520. In various embodiments, the seating portion 520*a* may include the open portion 521*a*. For example, the seating portion 520*a* may communicate with the acoustic duct 521. In various embodiments, the waterproof assembly 550 may be disposed in the seating portion 520*a*. The seating portion 520*a* may secure the position of the waterproof assembly 550 within the electronic device 501 by supporting at least a portion of the waterproof assembly 550.

In various embodiments, the PCB 530 may be disposed in the inner space 511 of the housing 510. In various embodiments, the PCB 530 may be disposed opposite to the display with the front frame 520 interposed therebetween. In various embodiments, the PCB 530 may include a first substrate surface 531 and a second substrate surface 532 opposite to the first substrate surface 531. In various embodiments, the PCB 530 may be disposed such that the second substrate surface 532 of the PCB 530 faces the display. In various embodiments, the PCB 530 may be secured to the front frame 520 such that the second substrate surface 532 contacts at least a portion of a surface of the front frame 520. In various embodiments, the PCB 530 may include an opening 530*a* that is at least partially open to penetrate through a surface of the PCB 530. In various embodiments, the opening 530*a* of the PCB 530 may overlap at least a portion of the acoustic duct 521, for example, the open portion 521*a* of the acoustic duct 521, with respect to a central axis C (e.g., in the Z-axis direction) perpendicular to the second substrate surface 532. In this case, sound input to the acoustic duct 521 may pass through the opening 530*a* via the open portion 521*a*.

In various embodiments, the acoustic module 540 may include at least one microphone 541. In various embodiments, the acoustic module 540 may be disposed in the PCB 530. For example, the acoustic module 540 may be mounted on a surface of the PCB 530 and may be electrically connected to an electrical circuit formed on the PCB 530. In various embodiments, the microphone 541 may be disposed on the first substrate surface 531 of the PCB 530. In various embodiments, the acoustic module 540 may be disposed on the first substrate surface 531 of the PCB 530. When the acoustic module 540 is disposed on the first substrate surface 531, the microphone 541 may be positioned in the opening 530a. For example, the microphone 541 may overlap the opening 530a based on the central axis C perpendicular to the first substrate surface 531 of the PCB 530. In various embodiments, when the PCB 530 is connected to the front frame 520, the microphone 541 may face the front frame 520. In various embodiments, the microphone 541, the opening 530a of the PCB 530, and the open portion 521a of the acoustic duct 521 may overlap each other with respect to the central axis C perpendicular to the first substrate surface 531 of the PCB 530. In various embodiments, sound input from the outside of the electronic device 501 to the acoustic duct 521 may be transmitted to the microphone 541 through the opening 530a of the PCB 530. For example, a sound transmission path may be formed from the outside of the electronic device 501 to the microphone 541 of the acoustic module 540 through the sound hole 513, the acoustic duct 521, and the opening 530a of the PCB 530. Accordingly, the microphone 541 may receive sound transmitted from the outside through the acoustic duct 521.

In various embodiments, the waterproof assembly 550 may be disposed between the PCB 530 and the front frame 520 and may transmit sound from the acoustic duct 521 to the microphone 541. In various embodiments, the waterproof assembly 550 may vibrate in response to sound waves input through the acoustic duct 521 and transmit the sound waves generated by the vibration to the microphone 541. In various embodiments, the waterproof assembly 550 may overlap the open portion 521a of the acoustic duct 521 and the opening 530a of the PCB 530 with respect to the central axis C perpendicular to the first substrate surface 531 of the PCB 530. In various embodiments, the waterproof assembly 550 may seal a gap formed between the front frame 520 and the PCB 530 along the perimeters of the open portion 521a of the acoustic duct 521 and the opening 530a, thereby preventing or reducing sound leaks from occurring during sound transmission. The waterproof assembly 550 may prevent or reduce foreign substances including moisture from entering through the open portion 521a and the opening 530a.

In various embodiments, the waterproof assembly 550 may be mounted on the seating portion 520a of the front frame 520. In various embodiments, when the waterproof assembly 550 is mounted on the seating portion 520a, at least a portion of the periphery of the waterproof assembly 550 may be supported by the seating portion 520a. In various embodiments, at least a portion of the waterproof assembly 550 may include a compressible material. In various embodiments, the waterproof assembly 550 may seal the gap between the front frame 520 and the PCB 530 by being compressed in a thickness direction (e.g., the Z-axis direction) of the waterproof assembly 550 during the process of the PCB 530 being secured to the front frame 520. In various embodiments, the waterproof assembly 550 may be formed to have a compressed thickness substantially corresponding to the gap between the PCB 530 and the front frame 520 adjacent to the opening 530a based on a state in which the PCB 530 is secured to the front frame 520, thereby ensuring ease of assembly of the front frame 520 and the PCB 530. In various embodiments, the waterproof assembly 550 may include a plurality of members having different physical properties.

Figure 7A:
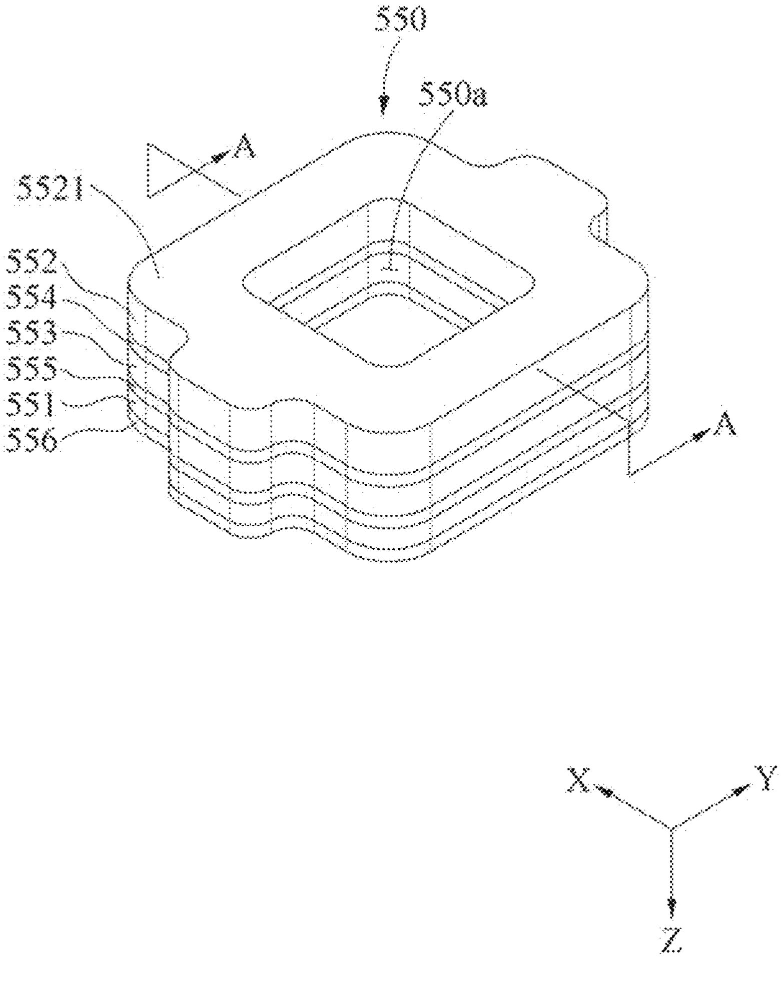
FIG. 7A is a perspective view of a waterproof assembly according to various embodiments.
Figure 7B:
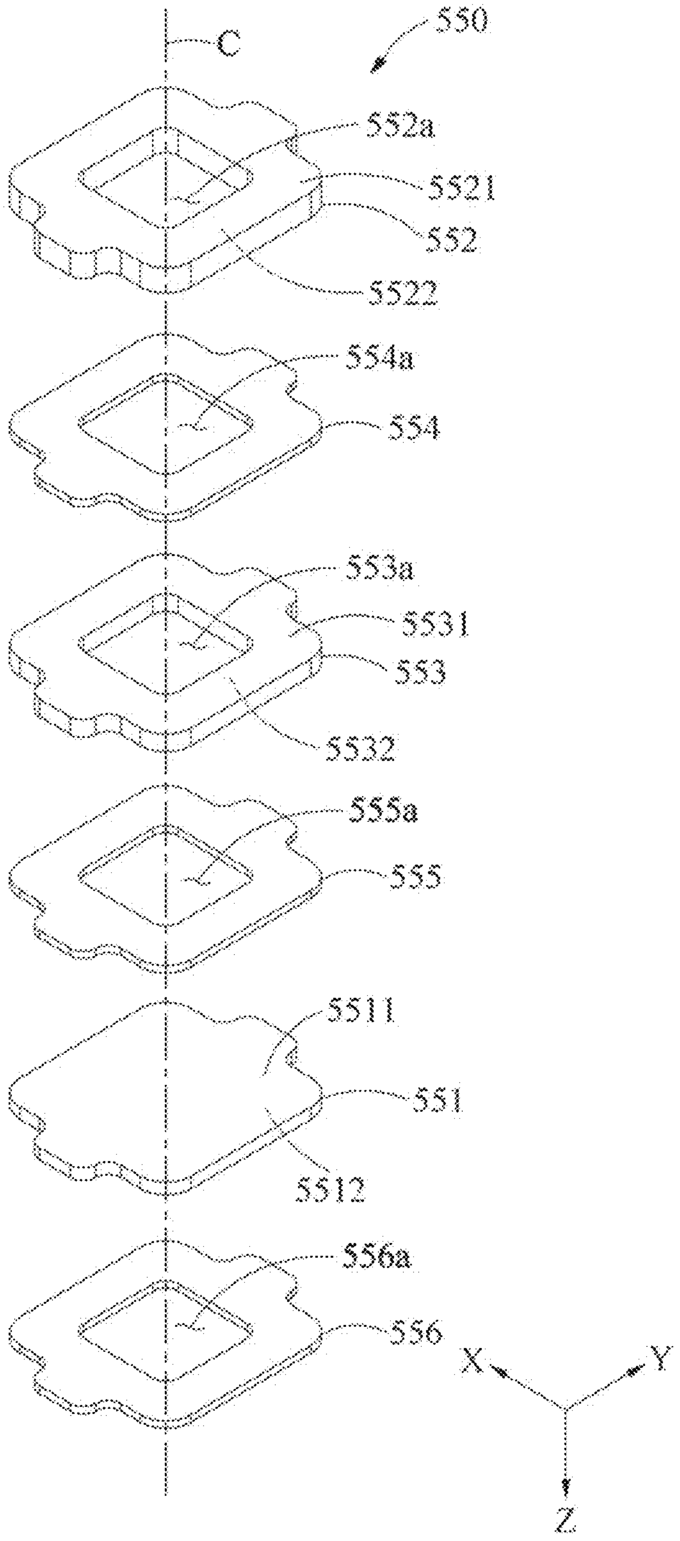
FIG. 7B is an exploded perspective view of the waterproof assembly according to FIG. 7A.
Figure 7C:
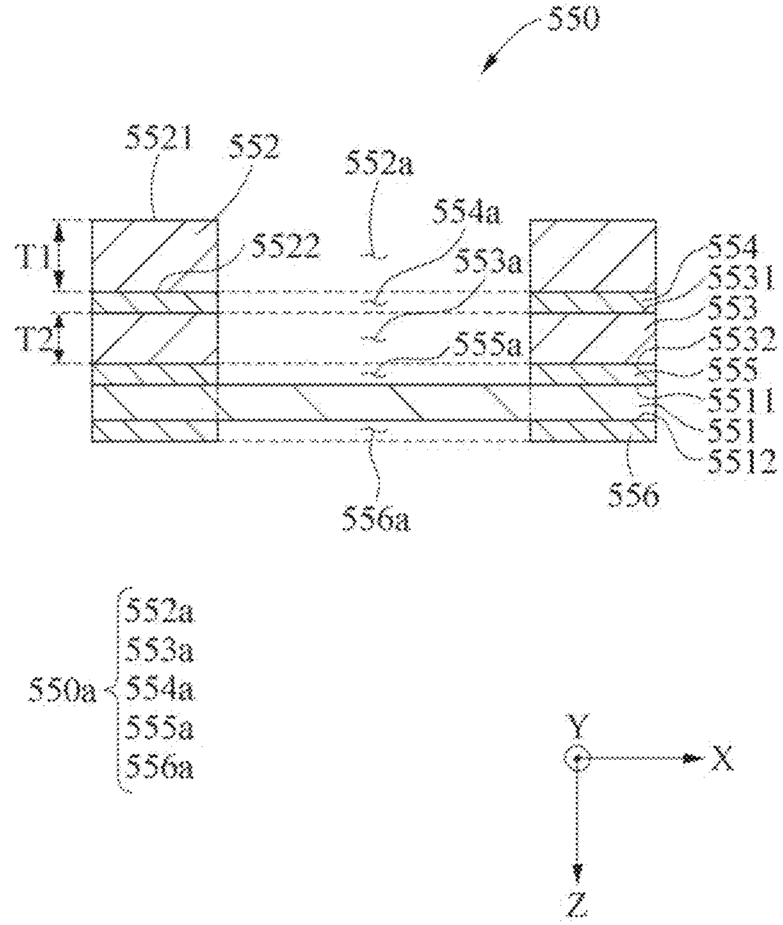
FIG. 7C is a cross-sectional view of the waterproof assembly taken along line A-A of FIG. 7A.

FIG. 7A is a perspective view of a waterproof assembly according to various embodiments, FIG. 7B is an exploded perspective view of the waterproof assembly according to FIG. 7A, and FIG. 7C is a cross-sectional view of the waterproof assembly taken along line A-A of FIG. 7A.

Referring to FIGS. 7A, 7B, and 7C, the waterproof assembly 550 according to various embodiments may be formed as a multilayer structure in which a plurality of members is connected in a thickness direction (e.g., the Z-axis direction). In various embodiments, the waterproof assembly 550 may include a vibrating membrane 551 that transmits sound through vibration, a first sealing member 552 disposed on the vibrating membrane 551, a second sealing member 553 disposed between the vibrating membrane 551 and the first sealing member 552, a first adhesive layer 554 connecting the first sealing member 552 and the second sealing member 553, a second adhesive layer 555 connecting the second sealing member 553 and the vibrating membrane 551, and a third adhesive layer 556 connecting the front frame 520 and the vibrating membrane 551.

In various embodiments, the vibrating membrane 551 may transmit sound by vibrating in accordance with sound waves. In various embodiments, the vibrating membrane 551 may be an acoustic membrane. In various embodiments, the vibrating membrane 551 may prevent or reduce malfunction of the microphone 541 (e.g., the microphone 541 of FIG. 5) due to dust and water. In various embodiments, the vibrating membrane 551 may include a material that allows gases such as air or sound to pass through but does not allow liquids or dust to pass through. For example, the vibrating membrane 551 may include at least one material among polytetrafluoroethylene (PTFE), expanded PTFE (ePTFE), and polyvinylidene fluoride (PVDF). However, this is only an example, and the material of the vibrating membrane 551 may include various materials according to embodiments. In various embodiments, the vibrating membrane 551 may include a first vibrating surface 5511 and a second vibrating surface 5512 opposite to the first vibrating surface 5511.

In various embodiments, when the waterproof assembly 550 is disposed between a front frame (e.g., the front frame 520 of FIG. 6) and a PCB (e.g., the PCB 530 of FIG. 6) as shown in FIG. 6, the vibrating membrane 551 may vibrate according to sound waves transmitted through the acoustic duct 521 and transmit the sound waves according to the vibration to a microphone (e.g., the microphone 541 of FIG. 6). Hereinafter, for ease of description, the waterproof assembly 550 may be disposed in an electronic device (e.g., the electronic device 501 of FIG. 5) such that the first vibrating surface 5511 of the vibrating membrane 551 faces a second substrate surface (e.g., the second substrate surface 532 of FIG. 6) of the PCB 530, but the present disclosure is not limited thereto.

In various embodiments, the vibrating membrane 551 may be attached to the front frame 520 via the third adhesive layer 556. In various embodiments, the vibrating membrane 551 may include the first vibrating surface 5511 forming an upper surface (e.g., a −Z-direction surface in FIG. 7B) with respect to a thickness direction (e.g., a Z-direction surface in FIG. 7A) of the waterproof assembly 550 and the second vibrating surface 5512 opposite to the first vibrating surface 5511 and forming a lower surface (e.g., a +Z-direction surface in FIG. 7B) of the vibrating membrane 551.

In various embodiments, the first sealing member 552 may be disposed to face the first vibrating surface 5511 of the vibrating membrane 551. In various embodiments, along the thickness direction of the waterproof assembly 550, the first sealing member 552 may include a first sealing surface 5521 and a second sealing surface 5522 opposite to the first sealing surface 5521. In various embodiments, the first sealing surface 5521 may face the PCB 530, and the second sealing surface 5522 may face the first vibrating surface 5511 of the vibrating membrane 551. In various embodiments, when the waterproof assembly 550 is disposed between the front frame 520 and the PCB 530 as shown in FIG. 6, the first sealing member 552 may contact the second substrate surface 532 of the PCB 530 through the first sealing surface 5521.

In various embodiments, the second sealing member 553 may be disposed between the first sealing member 552 and the vibrating membrane 551. In various embodiments, along the thickness direction of the waterproof assembly 550, the second sealing member 553 may include a third sealing surface 5531 and a fourth sealing surface 5532 opposite to the third sealing surface 5531. In various embodiments, the third sealing surface 5531 may face the second sealing surface 5522 of the first sealing member 552, and the fourth sealing surface 5532 may face the first vibrating surface 5511 of the vibrating membrane 551.

In various embodiments, the first adhesive layer 554 may be disposed between the first sealing member 552 and the second sealing member 553 and may connect (e.g., bond) the second sealing surface 5522 and the third sealing surface 5531. In various embodiments, the second adhesive layer 555 may be disposed between the second sealing member 553 and the vibrating membrane 551 and may connect (e.g., bond) the fourth sealing surface 5532 and the first vibrating surface 5511.

In various embodiments, the third adhesive layer 556 may be disposed on the second vibrating surface 5512 of the vibrating membrane 551. In various embodiments, the third adhesive layer 556 may connect and/or attach the second vibrating surface 5512 to a surface of the front frame 520 when the waterproof assembly 550 is positioned on the seating portion 520*a* of the front frame 520.

In various embodiments, the first adhesive layer 554, the second adhesive layer 555, and the third adhesive layer 556 may include a tape member including an adhesive. In various embodiments, each of the first adhesive layer 554, the second adhesive layer 555, and the third adhesive layer 556 may have one of a single adhesive layer structure in which a single surface is formed as an adhesive layer or a double adhesive layer structure in which both surfaces are formed as adhesive layers. In various embodiments, each of the first adhesive layer 554, the second adhesive layer 555, and the third adhesive layer 556 may include at least one material among polyethylene, acrylic, silicone, rubber, epoxy, urethane, acrylic, polyolefin foam, and polyethylene terephthalate (PET) film to relieve compressive force and shear stresses and prevent or reduce damage to the waterproof assembly 550, but this is only an example and the material of the adhesive layer is not limited thereto. In various embodiments, the first adhesive layer 554, the second adhesive layer 555, and the third adhesive layer 556 may be at least partially compressed when the waterproof assembly 550 is compressed in the thickness direction between the front frame 520 and the PCB 530.

In various embodiments, the first sealing member 552 and the second sealing member 553 may be compressed. For example, the first sealing member 552 and the second sealing member 553 may be compressed in the thickness direction during the process of the PCB 530 being secured to the front frame 520 and may change the form of the waterproof assembly 550. In various embodiments, when the waterproof assembly 550 is compressed in the thickness direction, the first sealing member 552 and the second sealing member 553 may each buffer the pressure applied to the waterproof assembly 550, thereby preventing or reducing damage to the vibrating membrane 551. The first sealing member 552 and the second sealing member 553 may stably seal the gap between the PCB 530 and the front frame 520 by applying a restoring force according to compression so that the waterproof assembly 550 is in close contact with the PCB 530 and the front frame 520.

In various embodiments, the first sealing member 552 and the second sealing member 553 may have different physical properties. In various embodiments, the first sealing member 552 and the second sealing member 553 may have different densities. For example, the first sealing member 552 may have a first density, and the second sealing member 553 may have a second density lower than the first density. In various embodiments, the first sealing member 552 and the second sealing member 553 may have different elastic moduli. For example, the second sealing member 553 may have a lower elastic modulus than the first sealing member 552. Since the second sealing member 553 is disposed relatively closer to the vibrating membrane 551 than the first sealing member 552 with respect to the thickness direction of the waterproof assembly 550, the second sealing member 553 may be compressed relatively more easily than the first sealing member 552 and may directly buffer the pressure applied to the vibrating membrane 551.

In various embodiments, the first sealing member 552 and the second sealing member 553 may have different compression resistances to the pressure applied when the waterproof assembly 550 is compressed, thereby ensuring high sealing performance while compensating for processing deviations during the assembly process. For example, since the degree of compression of the first sealing member 552 and the second sealing member 553 may vary depending on the manufacturing tolerance, the assembly performance between the front frame 520 and the PCB 530 may be secured through sufficient compression of the waterproof assembly 550, while the sealing function between the front frame 520 and the PCB 530 may also be maintained due to the difference in the relative compression resistance of the first sealing member 552 and the second sealing member 553.

In various embodiments, the first sealing member 552 may include a first compressible material, and the second sealing member 553 may include a second compressible material. In various embodiments, a surface of the first sealing member 522, for example, the first sealing surface 5521 and the second sealing surface 5522, may be treated with a velvet, matte, or suede finish to relieve compressive force and facilitate adhesion to the first adhesive layer 554. In various embodiments, the first compressible material and the second compressible material may include, but are not limited to, at least one of a rubber material (e.g., liquid silicone rubber (LSR), acrylonitrile rubber (NBR), urethane rubber (EU), silicone rubber (VMQ), fluorine rubber (FKM, FPM), and the like) and a sponge material. In various embodiments, the first sealing member 552 and the second sealing member 553 may include different materials. For example, the first sealing member 552 may include a rubber material, and the second sealing member 553 may include a sponge material. In various embodiments, the first sealing member 552 and the second sealing member 553 may include the same material. In various embodiments, when the first sealing member 552 and the second sealing member 553 are formed of the same material, the first sealing member 552 and the second sealing member 553 may be formed to have different physical properties, for example, different densities.

In various embodiments, based on the thickness direction of the waterproof assembly 550, the first sealing member 552 may have a first thickness T1, and the second sealing member 553 may have a second thickness T2 different from the first thickness T1. In various embodiments, the first thickness T1 of the first sealing member 552 may be thicker than the second thickness T2 of the second sealing member 553. The first thickness T1 and the second thickness T2 of the first sealing member 552 and the second sealing member 553, respectively, may vary depending on a design value of the waterproof assembly 550 disposed between the front frame 520 and the PCB 530. In various embodiments, since the waterproof assembly 550 is manufactured by connecting the first sealing member 552 and the second sealing member 553, the thickness of the entire waterproof assembly 550 may be easily adjusted by adjusting the thickness T1 and T2 of at least one of the first sealing member 552 and the second sealing member 553. Therefore, the difficulty of assembling the waterproof assembly 550 according to manufacturing tolerance may be significantly reduced.

In various embodiments, the waterproof assembly 550 may be formed in the thickness direction and may include a through hole 550*a* for sound to travel through. In various embodiments, the through hole 550*a* may be sealed inside the waterproof assembly 550 by the vibrating membrane 551. The vibrating membrane 551 may vibrate by transmitted sound waves to form sound waves, and the formed sound waves may be transmitted to the outside of the waterproof assembly 550, for example, to the microphone 541, through the through hole 550*a*. In various embodiments, the through hole 550*a* formed in the waterproof assembly 550 may be formed to at least partially overlap the open portion 521*a* of the acoustic duct 521 formed through the inside of the front frame 520, the seating portion 520*a* formed in the front frame 520, the opening 530*a* formed through the PCB 530, and the microphone 541 of the acoustic module 540 with respect to the central axis C perpendicular to the first sealing surface 5521 of the first sealing member 552.

In various embodiments, the through hole 550*a* may be formed to penetrate the first sealing member 552, the second sealing member 553, the first adhesive layer 554, the second adhesive layer 555, and the third adhesive layer 556. In various embodiments, a first through hole 552*a* formed in the thickness direction may be formed in the first sealing member 552, a second through hole 553*a* formed in the thickness direction may be formed in the second sealing member 553, a first adhesive through hole 554*a* formed in the thickness direction may be formed in the first adhesive layer 554, and a second adhesive through hole 555*a* formed in the thickness direction may be formed in the second adhesive layer 555. In various embodiments, a third adhesive through hole 556*a* may be formed in the third adhesive layer 556 opposite to the second adhesive through hole 555*a* along the thickness direction, with the vibrating membrane 551 interposed therebetween. In various embodiments, the first through hole 552*a*, the second through hole 553*a*, the first adhesive through hole 554*a* and the second adhesive through hole 555*a* may communicate with each other. The vibrating membrane 551 may be waterproof and/or dust-proof between the second adhesive through hole 555*a* and the third adhesive through hole 556*a*. In various embodiments, with respect to the central axis C perpendicular to a cross-section of the waterproof assembly 550, the first through hole 552*a*, the second through hole 553*a*, the first adhesive through hole 554*a*, the second adhesive through hole 555*a*, and the third adhesive through hole 556*a* may substantially overlap.

Figure 8A:
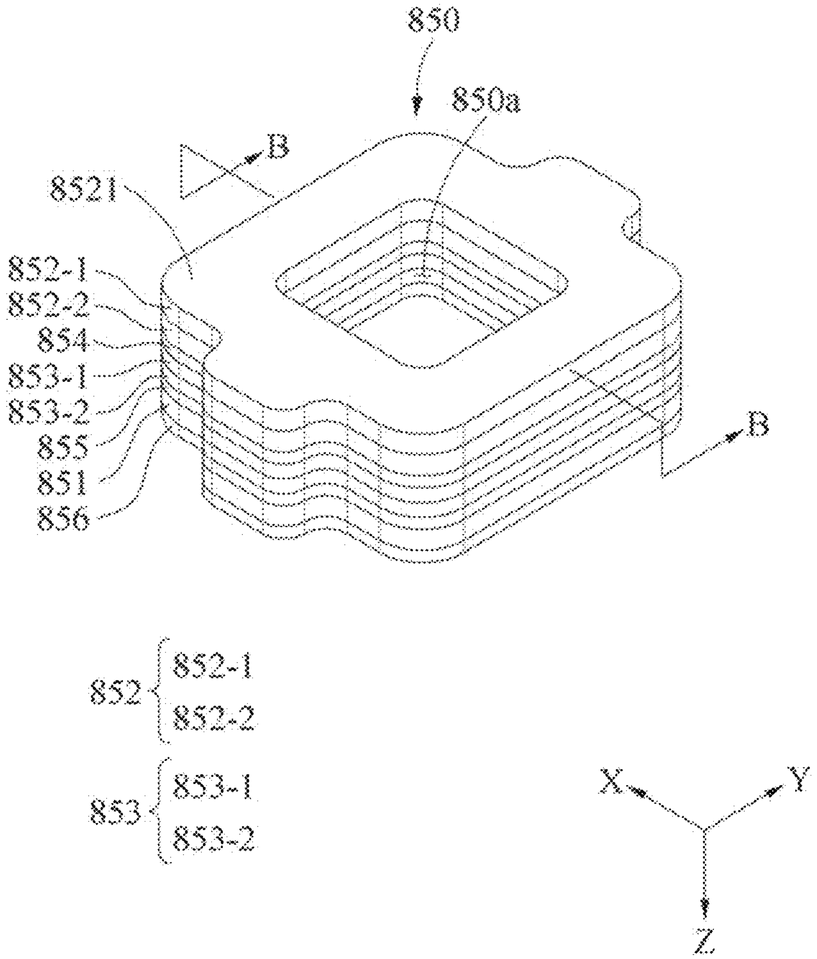
FIG. 8A is a perspective view of the waterproof assembly according to various embodiments.
Figure 8B:
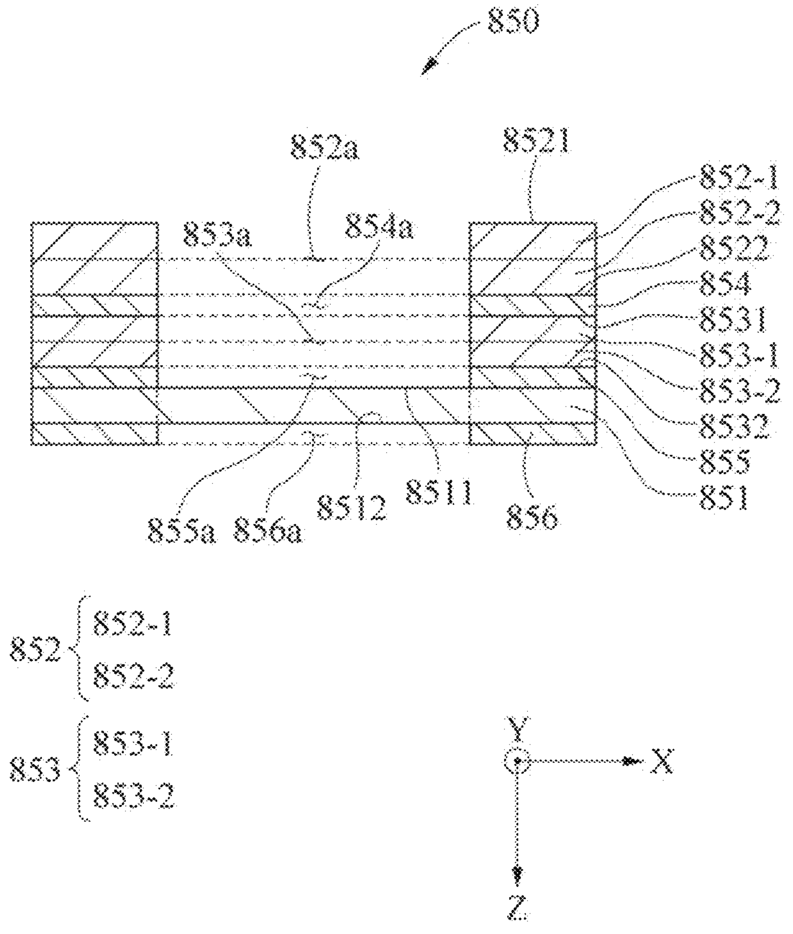
FIG. 8B is a cross-sectional view of the waterproof assembly taken along line B-B of FIG. 8A.

FIG. 8A is a perspective view of a waterproof assembly according to various embodiments, and FIG. 8B is a cross-sectional view of the waterproof assembly taken along line B-B of FIG. 8A.

Referring to FIGS. 8A and 8B, a waterproof assembly 850 (e.g., the waterproof assembly 550 of FIG. 7A) according to various embodiments may include a vibrating membrane 851 (e.g., the vibrating membrane 551 of FIG. 7A) that transmits sound through vibration, a first sealing member 852 (e.g., the first sealing member 552 of FIG. 7A) disposed on the vibrating membrane 851, a second sealing member 853 (e.g., the second sealing member 553 of FIG. 7A) disposed between the vibrating membrane 851 and the first sealing member 852, a first adhesive layer 854 (e.g., the first adhesive layer 554 of FIG. 7A) connecting the first sealing member 852 and the second sealing member 853, a second adhesive layer 855 (e.g., the second adhesive layer 555 of FIG. 7A) connecting the second sealing member 853 and the vibrating membrane 851, and a third adhesive layer 856 (e.g., the third adhesive layer 556 of FIG. 7A) connecting a front frame (e.g., the front frame 520 of FIG. 5) and the vibrating membrane 851.

In various embodiments, the vibrating membrane 851 may include a first vibrating surface 8511 (e.g., the first vibrating surface 5511 of FIG. 7B) and a second vibrating surface 8512 (e.g., the second vibrating surface 5512 of FIG. 7B) opposite to the first vibrating surface 8511. In various embodiments, the first sealing member 852 may include a first sealing surface 8521 (e.g., the first sealing surface 5521 of FIG. 7B) and a second sealing surface 8522 (e.g., the second sealing surface 5522 of FIG. 7B) opposite to the first sealing surface 8521. In various embodiments, the second sealing member 853 may include a third sealing surface 8531 (e.g., the third sealing surface 5531 of FIG. 7B) and a fourth sealing surface 8532 (e.g., the fourth sealing surface 5532 of FIG. 7B) opposite to the third sealing surface 8531.

In various embodiments, the first sealing member 852 may include a first portion 852-1 and a second portion 852-2, when viewed in a thickness direction (e.g., a Z-axis direction of FIG. 8A) of the waterproof assembly 850. In various embodiments, the first portion 852-1 may form the first sealing surface 8521 of the first sealing member 852. In various embodiments, the first portion 852-1 may be disposed to contact a second substrate surface (e.g., the second substrate surface 532 of FIG. 6) of a PCB (e.g., the PCB 530 of FIG. 5) when the PCB 530 is secured to the front frame 520. In various embodiments, the second portion 852-2 may form the second sealing surface 8522 of the first sealing member 852. In various embodiments, the second portion 852-2 may be connected to the first portion 852-1 so as to face the vibrating membrane 851.

In various embodiments, the second sealing member 853 may include a third portion 853-1 and a fourth portion 853-2, based on the thickness direction (e.g., the Z-axis direction of FIG. 8A) of the waterproof assembly 850. In various embodiments, the third portion 853-1 may form the third sealing surface 8531 of the second sealing member 853. In various embodiments, the third portion 853-1 may be disposed to face the second portion 852-2 of the first sealing member 852. In various embodiments, the fourth portion 853-2 may form the fourth sealing surface 8532 of the second sealing member 853. In various embodiments, the fourth portion 853-2 may be connected to the third portion 853-1, with respect to a direction toward the vibrating membrane 851.

In various embodiments, the first portion 852-1 and the second portion 852-2 may be formed of different materials, and the third portion 853-1 and the fourth portion 853-2 may be formed of different materials. In various embodiments, the first portion 852-1 and the third portion 853-1 may be formed of a compressible rubber or sponge material. In various embodiments, the second portion 852-2 and the fourth portion 853-2 may be formed of PET or polycarbonate (PC) material. In various embodiments, each of the second part 852-2 and the fourth part 853-2 may form a layer supporting the first portion 852-1 and the third portion 853-1, thereby improving the stability of the first sealing member 852 and the second sealing member 853.

In various embodiments, the waterproof assembly 850 may be formed in the thickness direction and include a through hole 850*a* (e.g., the through hole 550*a* of FIG. 7A) for sound to travel through. In various embodiments, the through hole 850*a* may be formed to at least partially overlap the acoustic duct 521 formed through the inside of the front frame 520, the seating portion 520*a* formed in the front frame 520, the opening 530*a* formed through the PCB 530, and the microphone 541 of the acoustic module 540 with respect to an axis (e.g., the Z-axis) perpendicular to the first sealing surface 8521 of the first sealing member 852.

In various embodiments, the through hole 850*a* may be formed to penetrate the first sealing member 852, the second sealing member 853, the first adhesive layer 854, the second adhesive layer 855, and the third adhesive layer 856. In various embodiments, a first through hole 852*a* (e.g., the first through hole 552*a* of FIG. 7B) formed in the thickness direction may be formed in the first sealing member 852, a second through hole 853*a* (e.g., the second through hole 553*a* of FIG. 7B) formed in the thickness direction may be formed in the second sealing member 853, a first adhesive through hole 854*a* (e.g., the first adhesive through hole 554*a* of FIG. 7B) formed in the thickness direction may be formed in the first adhesive layer 854, and a second adhesive through hole 855*a* (e.g., the second adhesive through hole 555*a* of FIG. 7B) formed in the thickness direction may be formed in the second adhesive layer 855. In various embodiments, a third adhesive through hole 856*a* (e.g., the third adhesive through hole 556*a* of FIG. 7B) may be formed in the third adhesive layer 856 opposite to the second adhesive through hole 855*a* along the thickness direction, with the vibrating membrane 851 interposed therebetween. In various embodiments, the first through hole 852*a*, the second through hole 853*a*, the first adhesive through hole 854*a* and the second adhesive through hole 855*a* may communicate with each other. The vibrating membrane 851 may be waterproof and/or dustproof between the second adhesive through hole 855*a* and the third adhesive through hole 856*a*. In various embodiments, with respect to a central axis C perpendicular to a cross-section of the waterproof assembly 850, the first through hole 852*a*, the second through hole 853*a*, the first adhesive through hole 854*a*, the second adhesive through hole 855*a*, and the third adhesive through hole 856*a* may substantially overlap.

An electronic device 301 or 501 according to various embodiments may include: a housing 310 or 510 including a front surface 310*a*, a rear surface 310*b* opposite to the front surface 310*a*, and a side surface 311*c* or 510*c* surrounding an inner space 511 between the front surface 310*a* and the rear surface 310*b*, the housing 310 or 510 having a sound hole 313, 315, 355, or 513 formed therein to transmit sound from the outside to the inner space 511; a display 361 visually exposed to the outside through the front surface 310*a*; a front frame 320 or 520 disposed in the inner space 511 and having formed therein an acoustic duct 521 which communicates with the sound hole 313, 315, 355, or 513 and through which the sound may travel; a PCB 431, 432, or 530 disposed in the inner space 511 and including a first substrate surface 531, a second substrate surface 532 opposite to the first substrate surface 531 and facing the front frame 320 or 520, and an opening 530*a* formed through to overlap the acoustic duct 521 in a direction toward the first substrate surface 531; an acoustic module 440 or 540 disposed on the first substrate surface 531 and including a microphone 541 positioned to overlap the opening 530*a* in the direction toward the first substrate surface 531; and a waterproof assembly 550 or 850 disposed between the PCB 431, 432, or 530 and the front frame 320 or 520 to overlap the opening 530*a* in the direction toward the first substrate surface 531, and configured to transmit sound to the microphone 541 from the acoustic duct 521 through the opening 530*a*. In various embodiments, the waterproof assembly 550 or 850 may include a vibrating membrane 551 or 851 configured to transmit sound through vibration, a first sealing member 552 or 852 formed of a compressible material and disposed on the vibrating membrane 551 or 851 to face the PCB 431, 432, or 530, and a second sealing member 553 or 853 formed of a compressible material and disposed between the vibrating membrane 551 or 851 and the first sealing member 552 or 852.

In various embodiments, the first sealing member 552 or 852 and the second sealing member 553 or 853 may have different physical properties.

In various embodiments, the first sealing member 552 or 852 and the second sealing member 553 or 853 may have different elastic modulus.

In various embodiments, the first sealing member 552 or 852 and the second sealing member 553 or 853 may be formed of different materials.

In various embodiments, the first sealing member 552 or 852 may be formed of a rubber material, and the second sealing member 553 or 853 may be formed of a sponge material.

In various embodiments, the first sealing member 552 or 852 and the second sealing member 553 or 853 may be formed of the same material and have different densities.

In various embodiments, the first sealing member 552 or 852 may have a first density, and the second sealing member 553 or 853 may have a second density lower than the first density.

In various embodiments, the first sealing member 552 or 852 may have a first thickness T1, and the second sealing member 553 or 853 may have a second thickness T2 different from the first thickness T1.

In various embodiments, a first through hole 552*a* or 852*a* formed penetrating in a thickness direction may be formed in the first sealing member 552 or 852, and a second through hole 553*a* or 853*a* formed penetrating in the thickness direction and having a shape substantially overlapping the first through hole 552*a* or 852*a* in the thickness direction may be formed in the second sealing member 553 or 853.

In various embodiments, the waterproof assembly 550 or 850 may further include at least one of a first adhesive layer 554 or 854 disposed between the first sealing member 552 or 852 and the second sealing member 553 or 853 and connecting the first sealing member 552 or 852 and the second sealing member 553 or 853, or a second adhesive layer 555 or 855 disposed between the second sealing member 553 or 853 and the vibrating membrane 551 or 851 and connecting the second sealing member 553 or 853 and the vibrating membrane 551 or 851, wherein each of the first adhesive layer 554 or 854 and the second adhesive layer 555 or 855 may have an adhesive through hole 554*a*, 555*a*, 556*a*, 854*a*, 855*a*, or 856*a* formed at an overlapping position.

In various embodiments, the waterproof assembly 550 or 850 may further include a third adhesive layer 556 or 856 disposed on a surface of the vibrating membrane 551 or 851 to be opposite to the first sealing member 552 or 852 and for attaching the waterproof assembly 550 or 850 to the front frame 320 or 520.

In various embodiments, the waterproof assembly 550 or 850 may be mounted on the front frame 320 or 520, and a seating portion 520*a* may be formed to maintain a position of the mounted waterproof assembly 550 or 850, wherein the seating portion 520*a* may communicate with the acoustic duct 521.

In various embodiments, the seating portion 520*a* may be formed to support at least a portion of the periphery of the waterproof assembly 550 or 850 in a direction toward the first substrate surface 531 in a state in which the waterproof assembly 550 or 850 is secured.

In various embodiments, in a state in which the PCB 431, 432, or 530 is secured to the front frame 320 or 520, the second substrate surface 532 may be in contact with at least a portion of the front frame 320 or 520, and the waterproof assembly 550 or 850 may be disposed between the PCB 431, 432, or 530 and the front frame 320 or 520 in a compressed state in a thickness direction.

In various embodiments, based on a thickness direction of the waterproof assembly 850, the first sealing member 852 may include, in a state in which the PCB 431, 432, or 530 is secured to the front frame 320 or 520, a first portion 852-1 contacting the second substrate surface 532 and a second portion 852-2 connected to the first portion 852-1 to face the vibrating membrane 851 and formed of a different material from the first portion 852-1, and the second sealing member 853 may include a third portion 853-1 facing the second portion 852-2 and a fourth portion 853-2 connected to the third portion 853-1 to face the vibrating membrane 851 and formed of a different material from the third portion 853-1.

In various embodiments, the front frame 320 or 520 may be positioned between the display 361 and the PCB 431, 432, or 530.

A waterproof assembly 550 or 850 for transmitting sound according to various embodiments may include a first sealing member 552 or 852 including a first sealing surface 5521 or 8521 and a second sealing surface 5522 or 8522 opposite to the first sealing surface 5521 or 8521 and including a first compressible material, a second sealing member 553 or 853 including a third sealing surface 5531 or 8531 facing the second sealing surface 5522 or 8522 and a fourth sealing surface 5532 or 8532 opposite to the third sealing surface 5531 or 8531, and including a second compressible material, and a vibrating membrane 551 or 851 that vibrates by sound waves and transmits sound, and that includes a first vibrating surface 5511 or 8511 facing the fourth sealing surface 5532 or 8532 and a second vibrating surface 5512 or 8512 opposite to the first vibrating surface 5511 or 8511, wherein a first through hole 552*a* or 852*a* formed in the thickness direction is formed in the first sealing member 552 or 852 and a second through hole 553*a* or 853*a* formed in the thickness direction and having substantially the same shape as the first through hole 552*a* or 852*a* is formed in the second sealing member 553 or 853, and wherein the first compressible material and the second compressible material may be different.

In various embodiments, based on the elastic modulus according to compression in the thickness direction, the first sealing member 552 or 852 and the second sealing member 553 or 853 may have different elastic modulus.

In various embodiments, the first compressible material may include a rubber material, and the second compressible material may include a sponge material.

In various embodiments, the waterproof assembly 550 or 850 may further include a first adhesive layer 554 or 854 disposed between the first sealing member 552 or 852 and the second sealing member 553 or 853 to connect the first sealing member 552 or 852 and the second sealing member 553 or 853, a second adhesive layer 555 or 855 disposed between the second sealing member 553 or 853 and the vibrating membrane 551 or 851 to connect the second sealing member 553 or 853 and the vibrating membrane 551 or 851, and a third adhesive layer 556 or 856 disposed on a surface of the vibrating membrane 551 or 851 so as to be opposite to the first sealing member 552 or 852.

The electronic device 301 or 501 according to various embodiments may include: the housing 310 or 510 that forms the exterior of the electronic device 301 or 501 and includes the sound hole 313, 315, 355, or 513 for transmitting sound; the display 361 that is visually exposed to the outside through the front 310*a* of the electronic device 301 or 501; the front frame 320 or 520 that is disposed in the inner space 511 of the housing 310 or 510 and having formed therein the acoustic duct 521 which communicates with the sound hole 313, 315, 355, or 513 and through which the sound may travel; the PCB 431, 432, or 530 disposed in the inner space 511 and including the first substrate surface 531, the second substrate surface 532 opposite to the first substrate surface 531 and facing the front frame 320 or 520, and the opening 530*a* formed through to overlap the acoustic duct 521 in a direction toward the first substrate surface 531; the acoustic module 440 or 540 disposed on the first substrate surface 531 and including a microphone 541 positioned to overlap the opening 530*a* in the direction toward the first substrate surface 531; and the waterproof assembly 550 or 850 disposed between the PCB 431, 432, or 530 and the front frame 320 or 520 to overlap the opening 530*a* in the direction toward the first substrate surface 531, and configured to transmit sound to the microphone 541 from the acoustic duct 521 through the opening 530*a*, wherein the waterproof assembly 550 or 850 may include the vibrating membrane 551 or 851 configured to transmit sound through vibration, the first sealing member 552 or 852 formed of a rubber material and disposed on the vibrating membrane 551 or 851 to face the PCB 431, 432, or 530, the second sealing member 553 or 853 formed of a sponge material and disposed between the vibrating membrane 551 or 851 and the first sealing member 552 or 852, the first adhesive layer 554 or 854 disposed between the first sealing member 552 or 852 and the second sealing member 553 or 853 to connect the first sealing member 552 or 852 and the second sealing member 553 or 853, the second adhesive layer 555 or 855 disposed between the second sealing member 553 or 853 and the vibrating membrane 551 or 851 to connect the second sealing member 553 or 853 and the vibrating membrane 551 or 851, and the third adhesive layer 556 or 856 disposed on a surface of the vibrating membrane 551 or 851 to be opposite to the first sealing member 552 or 852 and for attaching the waterproof assembly 550 or 850 to the front frame 320 or 520. The first sealing member 552 or 852 and the second sealing member 553 or 853 may differ in at least one of density or thickness.

While the disclosure has been illustrated and described with reference to one or more embodiments, it will be understood that the one or more embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiments described herein may be used in conjunction with any other embodiments described herein.

What is claimed is:

1. An electronic device, comprising:

a housing comprising a front surface, a rear surface opposite to the front surface, a side surface surrounding an inner space between the front surface and the rear surface, and a sound hole configured to transmit sound from the outside to the inner space;

a display visually exposed to the outside through the front surface;

a front frame in the inner space and comprising an acoustic duct communicating with the sound hole and through which the sound may travel;

a printed circuit board (PCB) in the inner space and comprising a first substrate surface, a second substrate surface opposite to the first substrate surface and facing the front frame, and an opening overlapping the acoustic duct in a direction toward the first substrate surface;

an acoustic module on the first substrate surface and comprising a microphone overlapping the opening in the direction toward the first substrate surface; and a waterproof assembly between the PCB and the front frame and overlapping the opening in the direction toward the first substrate surface, and configured to transmit sound to the microphone from the acoustic duct through the opening, wherein the waterproof assembly comprises:

a vibrating membrane configured to transmit sound through vibration;

a first sealing member on the vibrating membrane and facing the PCB, the first sealing member being a compressible material; and a second sealing member between the vibrating membrane and the first sealing member, the second sealing member being a compressible material, wherein the first sealing member and the second sealing member have different physical properties.

2. The electronic device of claim 1, wherein an elastic modulus of the first sealing member is different from an elastic modulus of the second sealing member.

3. The electronic device of claim 1, wherein the first sealing member is a first material and the second sealing member is a second material, the first material and the second material being different materials.

4. The electronic device of claim 3, wherein the first sealing member is a rubber material, and wherein the second sealing member is a sponge material.

5. The electronic device of claim 1, wherein the first sealing member is a first material and the second sealing member is a second material, wherein the first material and the second material are the same material, and wherein the first material and the second material have different densities.

6. The electronic device of claim 5, wherein the first sealing member has a first density and the second sealing member has a second density less than the first density.

7. The electronic device of claim 1, wherein the first sealing member has a first thickness, and wherein the second sealing member has a second thickness different from the first thickness.

8. The electronic device of claim 1, wherein the first sealing member comprises a first through hole penetrating in a thickness direction, and wherein the second sealing member comprises a second through hole penetrating in the thickness direction and overlapping the first through hole in the thickness direction.

9. The electronic device of claim 1, wherein the waterproof assembly further comprises:

at least one of a first adhesive layer between the first sealing member and the second sealing member and connecting the first sealing member and the second sealing member or a second adhesive layer between the second sealing member and the vibrating membrane and connecting the second sealing member and the vibrating membrane, and wherein each of the first adhesive layer and the second adhesive layer comprises an adhesive through hole overlapping the first through hole and the second through hole.

10. The electronic device of claim 1, wherein the waterproof assembly further comprises a third adhesive layer on a surface of the vibrating membrane opposite to the first sealing member and configured to attach the waterproof assembly to the front frame.

11. The electronic device of claim 1, wherein the waterproof assembly is mounted on the front frame, wherein the front frame comprises a seating portion configured to maintain a position of the waterproof assembly, and wherein the seating portion communicates with the acoustic duct.

12. The electronic device of claim 11, wherein the seating portion is configured to support at least a portion of a periphery of the waterproof assembly in a direction toward the first substrate surface in a state in which the waterproof assembly is secured.

13. The electronic device of claim 1, wherein in a state in which the PCB is secured to the front frame, the second substrate surface contacts at least a portion of the front frame, and the waterproof assembly is between the PCB and the front frame in a compressed state in a thickness direction.

14. The electronic device of one of claim 1, wherein the first sealing member comprises:

a first portion contacting the second substrate surface in a state in which the PCB is secured to the front frame; and a second portion connected to the first portion and facing the vibrating membrane, the second portion being a different material than the first portion, and wherein the second sealing member comprises:

a third portion facing the second portion; and a fourth portion connected to the third portion and facing the vibrating membrane, the fourth portion being a different material than the third portion.

15. The electronic device of claim 1, wherein the front frame is between the display and the PCB.

* * * * *